United States Patent
Yen et al.

(10) Patent No.: US 9,613,669 B2
(45) Date of Patent: Apr. 4, 2017

(54) MATRIX TRANSPOSING CIRCUIT

(71) Applicant: Industrial Technology Research Institute, Hsinchu (TW)

(72) Inventors: Chih-Hsu Yen, Hsinchu County (TW); Fan-Di Jou, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 116 days.

(21) Appl. No.: 14/662,246

(22) Filed: Mar. 19, 2015

(65) Prior Publication Data

US 2016/0012012 A1    Jan. 14, 2016

(30) Foreign Application Priority Data

Jul. 8, 2014   (TW) .............................. 103123490 A

(51) Int. Cl.
*G11C 14/00* (2006.01)
*G11C 8/04* (2006.01)
*G11C 7/10* (2006.01)
*G11C 19/00* (2006.01)
*G11C 19/28* (2006.01)
(Continued)

(52) U.S. Cl.
CPC ............... *G11C 8/04* (2013.01); *G06F 7/785* (2013.01); *G11C 7/106* (2013.01); *G11C 7/1012* (2013.01); *G11C 7/1087* (2013.01); *G11C 19/00* (2013.01); *G11C 19/28* (2013.01); *G11C 19/38* (2013.01)

(58) Field of Classification Search
CPC ........... G11C 8/04; G11C 19/00; G11C 19/28; G11C 19/38; G11C 7/106; G11C 7/1012; G11C 7/1087; G06F 7/785
See application file for complete search history.

(56) References Cited

U.S. PATENT DOCUMENTS 6,021,420 A    2/2000  Takamuki
7,797,362 B2*  9/2010  Won .................. G06F 17/18
                                              708/400
(Continued)

FOREIGN PATENT DOCUMENTS

CN    101093474    12/2007
CN    102053948    5/2011

OTHER PUBLICATIONS

"Office Action of Taiwan Counterpart Application", issued on Jul. 21, 2016, p. 1-p. 7.

*Primary Examiner* — Richard Elms
*Assistant Examiner* — Mohammed A Bashar
(74) *Attorney, Agent, or Firm* — Jianq Chyun IP Office

(57) ABSTRACT

The disclosure provides a matrix transposing circuit for outputting a transposed N×N matrix. The matrix transposing circuit includes: an input resister array with m×N array; a memory having b storage blocks; an output register array with N×m array. N, m, n, b are integer in power of 2, N can be completely divided by m and n, and N=n×m×b. The matrix is divided into multiple sub-matrixes with m×n array to form Y matrix. Each of sub-matrixes is correspondingly stored to the b storage blocks. The input resister array has a first shifting direction to receive entry data and a second shifting direction to output data to the b storage blocks. The output resister array has a first shifting direction to read data from the b storage blocks and a second shifting direction to output the transposed matrix.

11 Claims, 12 Drawing Sheets

(51) Int. Cl.
  *G11C 19/38* (2006.01)
  *G06F 7/78* (2006.01)

(56) References Cited

U.S. PATENT DOCUMENTS

| | | | |
|---|---|---|---|
| 2004/0186869 A1* | 9/2004 | Natsume | G06F 7/785 |
| | | | 708/607 |
| 2005/0193050 A1 | 9/2005 | Sazegari | |
| 2010/0077176 A1* | 3/2010 | Pearlstein | G06F 7/785 |
| | | | 712/22 |

* cited by examiner

| a0 | a1 | a2 | a3 |
| b0 | b1 | b2 | b3 |
| c0 | c1 | c2 | c3 |
| d0 | d1 | d2 | d3 |
| e0 | e1 | e2 | e3 |
| f0 | f1 | f2 | f3 |
| g0 | g1 | g2 | g3 |
| h0 | h1 | h2 | h3 |
| i0 | i1 | i2 | i3 |
| j0 | j1 | j2 | j3 |
| k0 | k1 | k2 | k3 |
| l0 | l1 | l2 | l3 |
| m0 | m1 | m2 | m3 |
| n0 | n1 | n2 | n3 |
| o0 | o1 | o2 | o3 |
| p0 | p1 | p2 | p3 |

|   |   |   |   |   |   |   |   |   |   |   |   |   |   |   |   |
|---|---|---|---|---|---|---|---|---|---|---|---|---|---|---|---|
| q0 | r0 | s0 | t0 | u0 | v0 | w0 | x0 |   |   |   |   |   |   |   |   |
| q1 | r1 | s1 | t1 | u1 | v1 | w1 | x1 |   |   |   |   |   |   |   |   |
| q2 | r2 | s2 | t2 | u2 | v2 | w2 | x2 |   |   |   |   |   |   |   |   |
| q3 | r3 | s3 | t3 | u3 | v3 | w3 | x3 |   |   |   |   |   |   |   |   |
| q4 | r4 | s4 | t4 | u4 | v4 | w4 | x4 |   |   |   |   |   |   |   |   |
| q5 | r5 | s5 | t5 | u5 | v5 | w5 | x5 |   |   |   |   |   |   |   |   |
| q6 | r6 | s6 | t6 | u6 | v6 | w6 | x6 |   |   |   |   |   |   |   |   |
| q7 | r7 | s7 | t7 | u7 | v7 | w7 | x7 |   |   |   |   |   |   |   |   |

FIG. 13

MATRIX TRANSPOSING CIRCUIT

CROSS-REFERENCE TO RELATED APPLICATION

This application claims the priority benefit of Taiwan application serial no. 103123490, filed on Jul. 8, 2014. The entirety of the above-mentioned patent application is hereby incorporated by reference herein and made a part of this specification.

TECHNICAL FIELD

The disclosure relates to a circuit for transposing a matrix.

BACKGROUND

In video image processing, there are many operations that require matrix operations. For example, Advanced Video Coding (AVC), also called H.264/MPEG-4 Part 10, is a video compression technique for the recording, compression, and distribution of video content. In operation, there is a video coding that utilizes 4×4 or 8×8 two-dimensional discrete cosine transform/inverse discrete cosine transform (2D DCT/IDCT), and in the high efficiency video coding (HEVC) coding system, even a larger 16×16 or 32×32 2D DCT/IDCT. In very large scale integration (VLSI), a one-dimensional structure is used for a two-dimensional DCT/IDCT operation; for example a 4×4 shift register buffer to produce a DCT operation. Also, a number of memory banks have been utilized, for example for random access memory, to perform the DCT/IDCT operations. All of these operations require multiple matrix transform operations.

SUMMARY

The disclosure provides a matrix transposing circuit for transposing a N×N matrix into a transposed matrix of the matrix, including an m×N input register array, a memory and an N×m output register array. N, m, n, b are integers in power of 2, and N=n×m×b. The matrix is divided into multiple sub-matrixes, each of the sub-matrixes has m×n entries, a plurality of the entries of the sub-matrixes form a Y matrix. The input resister receives the entry data along a first shifting direction and outputs data to the b storage blocks along a second shifting direction for corresponding storing the data into the b storage blocks. The output resister array receives the entry data from the b storage blocks along the first shifting direction and outputs the entry data corresponding to the transposed matrix along the second shifting direction.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, explain the principles of the disclosure.

FIG. 13 is a diagram showing that the entries of the column vector of the matrix X are clustered by 2 entries as a unit according to an embodiment of the disclosure.

DETAILED DESCRIPTION OF DISCLOSED EMBODIMENTS

The matrix transposing circuit disclosed in the embodiments of the disclosure executes a transposing operation for a N×N matrix, wherein N is in power of 2. In operation, the column vectors are inputted and the row vectors are outputted, and vice versa. In the embodiments of the disclosure, for instance, the row vectors are transposed to the column vectors, but are not limited thereto. Various embodiments are used to explain the disclosure, but the disclosure is not limited to said embodiments.

Figure 1:
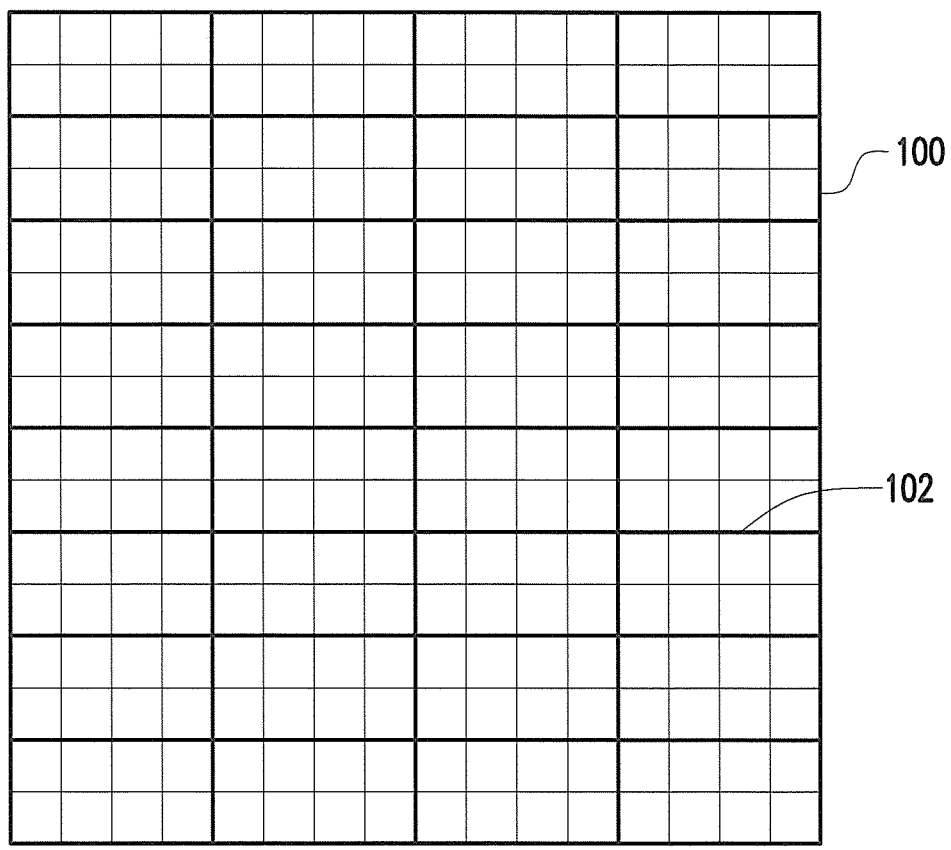
FIG. 1 is a diagram showing a plan for dividing a N×N matrix according to an embodiment of the disclosure.

FIG. 1 is a diagram showing a plan for dividing a N×N matrix according to an embodiment of the disclosure. For a matrix 100 is needed to be transposed, it must be a square matrix; for instance, the matrix 100 is an N×N matrix. As shown in FIG. 1, the matrix 100 is divided into multiple sub-matrix 102; for instance, a (N/m)×(N/n) Y matrix is obtained by grouping entries of the matrix 100 with m×n, in which the m and n are in power of 2 and can completely divide N, and m, n<N. In the embodiment shown in FIG. 1, N=16, m=2 and n=4. Each entry of the Y matrix $y_{i,j}$ represents an m×n sub-matrix 102. The sub-matrix 102 includes m×n entries $x_{i,j}$, in which $x_{i,j}$ is one entry of the matrix 100 and the matrix 100 is also referred as a matrix X.

As described above, the matrix Y is obtained by grouping the matrix 100. The planning of the memory according to the embodiment is described as follows. For instance, the memory for storing matrix Y is composed of b-band RAM (Random Access Memory), and therefore value of b must satisfy the condition of n×m×b=N and in power of 2. The total capacity of the memory is at least enough to store the matrix Y, and the addressing unit of the memory address is one $y_{i,j}$, that is, m×n $x_{i,j}$.

The rules for storing the matrix Y in the b-band RAM are as follows:

Rule 1: entries of each row need to be divided into b aliquots, and each aliquot is respectively stored in one of the b-bank RAM. Storing data of one row in the RAM needs m steps since data can be written into b-bank RAM simultaneously.

Rule 2: entries of each column are divided into b aliquots, and each aliquot is respectively stored in one of the b-bank RAM. Reading data of one column from the RAM needs n steps since data can be read from b-bank RAM simultaneously.

For instance, a 8×4 matrix Y is obtained by letting N=16, n=4, m=2 and b=2 for the matrix 100 as shown in FIG. 1. Each entry of the matrix Y represents a sub-matrix 102, and the matrix Y has 8×4 entries. In FIG. 1, the matrix 100 is overlapped with the matrix Y, in which the thin lines shows entries of the matrix 100 $x_{i,j}$ and bold lines shows entries $y_{i,j}$ of the matrix Y. One entry $y_{i,j}$ of the matrix Y represents the sub-matrix 102 of the matrix 100.

As described above, storing the entries $y_{i,j}$ of matrix Y to the RAM must follow said rule 1 and rule 2. For instance, given b=2 (i.e., there are 2-bank RAM), there are 4 patterns for storing the matrix Y to 2 RAM but is not limited thereto.

FIGS. 2a-2d show 4 patterns for storing 8×2 matrix Y in 2 RAM according to the embodiment of the disclosure. In FIGS. 2a-2d, the entries having the same background represents they are stored in the same RAM. According to rule 1 and rule 2, storing one row vector of the matrix Y to the RAM needs m=2 steps; and reading one column vectors of the matrix Y from the RAM needs n=4 steps, in which plans of each steps are the same.

Figure 2A:
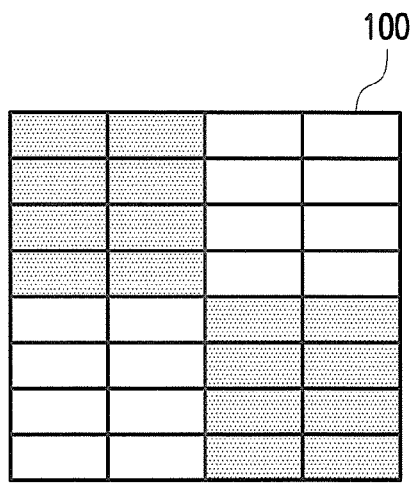
FIGS. 2a-2d show 4 patterns for storing 8×2 matrix Y in 2 RAM according to the embodiment of the disclosure.

Referring to FIG. 2a, the matrix Y is a 8×4 matrix, and $y_{i,j}$ (=1, 2, ..., 8, j=1,2,3,4) represent the entries of the matrix Y. The Y matrix is divided into a first block (i.e., first entry set of matrix Y) and a second block (i.e., second entry set of matrix Y) according to the condition of b=2, and entries of the first block are $\{y_{i,j}, i=1-4, j=1,2; \text{ and } y_{i,j}, i=5-8, j=3,4\}$ and entries of the second block are $\{y_{i,j}, i=1-4, j=3,4;$ and $y_{i,j}, i=5-8, j=1,2\}$.

Figure 2B:
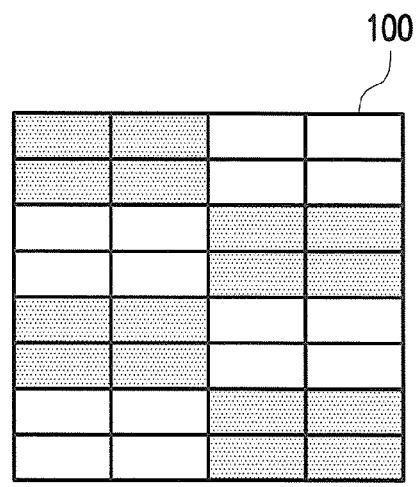

Referring to FIG. 2b, entries of the first block are $\{y_{i,j}, i=1,2, j=1,2; y_{i,j}, i=3,4, j=3,4; y_{i,j}, i=5,6, j=1,2; \text{ and } y_{i,j}, i=7,8, j=3,4\}$ and entries of the second block are $\{y_{i,j}, i=1,2, j=3,4; y_{i,j}, i=3,4, j=1,2; y_{i,j}, i=5,6, j=3,4; \text{ and } y_{i,j}, i=7,8, j=1,2\}$.

Figure 2C:
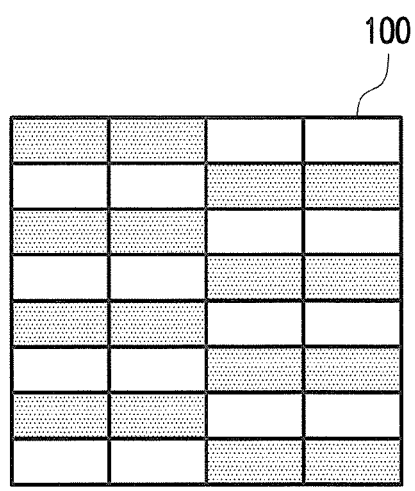

Referring to FIG. 2c, entries of the first block are $\{y_{i,j}, i=1, j=1,2; y_{i,j}, i=2, j=3,4; y_{i,j}, i=3, j=1,2; y_{i,j}, i=4, j=3,4; y_{i,j}, i=5, j=1,2; y_{i,j}, i=6, j=3,4; y_{i,j}, i=7, j=1,2; y_{i,j}, i=8, j=3,4\}$ and entries of the second block are $\{y_{i,j}, i=1, j=3,4; y_{i,j}, i=2, j=1,2; y_{i,j}, i=3, j=3,4; y_{i,j}, i=4, j=1,2; y_{i,j}, i=5, j=3,4; y_{i,j}, i=6, j=1,2; y_{i,j}, i=7, j=3,4; y_{i,j}, i=8, j=1,2\}$.

Figure 2D:
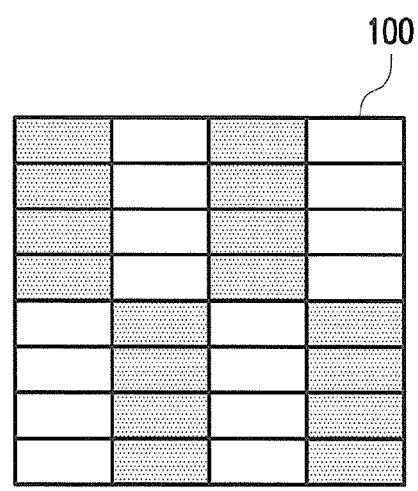

Referring to FIG. 2d, entries of the first block are $\{y_{i,j}, i=1-4 \ j=1,3; y_{i,j}, i=5-8, j=2,4\}$ and entries of the second block are $\{y_{i,j}, i=1-4 \ j=2,4; y_{i,j}, i=5-8, j=1,3\}$.

Figure 3:
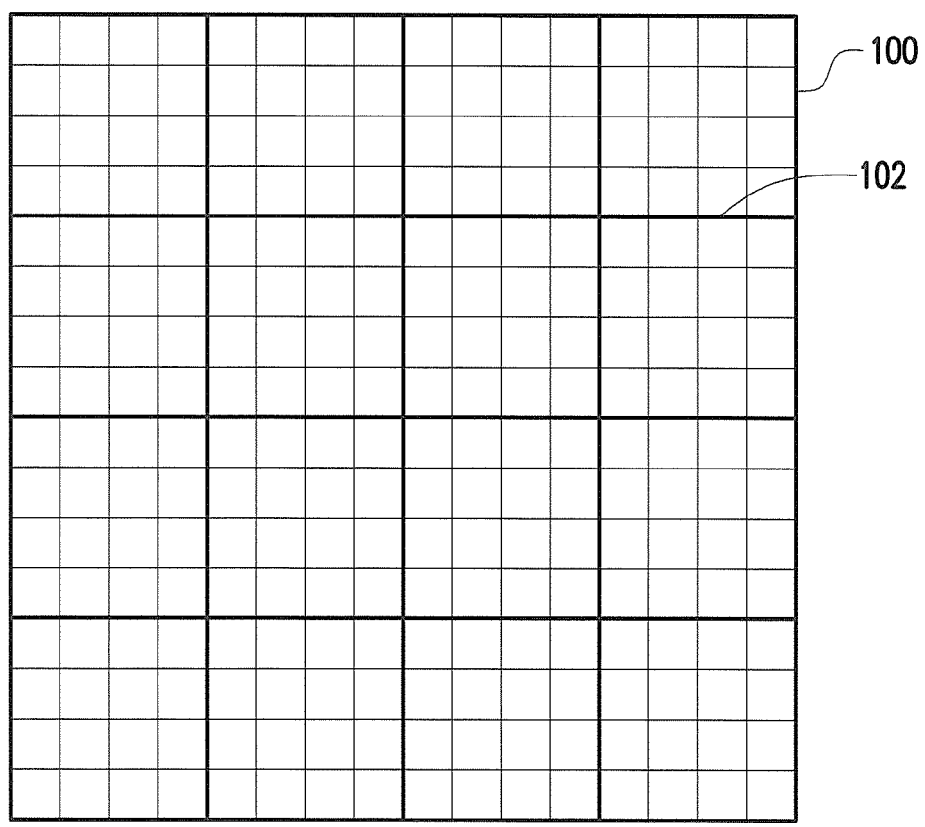
FIG. 3 is a diagram showing a plan for dividing a N×N matrix according to another embodiment of the disclosure.

FIG. 3 is a diagram showing a plan for dividing a N×N matrix according to another embodiment of the disclosure. Referring to FIG. 3, a 4×4 matrix Y is obtained by letting N=16, n=4, m=4, and b=1. Each entry of the matrix Y corresponds to a sub-matrix 102 and has 16 (4×4) entries $x_{i,j}$ of the matrix 100. In this embodiment, all of the entries have the same background since that they are all stored in the same RAM. Storing one row vector of the matrix Y to the RAM and reading one column vectors of the matrix Y from the RAM both need 4 steps.

According to said two embodiments, the transpose operation of the matrix Y can be achieved by dividing the matrix Y and storing the entries of the matrix Y in the RAM. Each row vector of the matrix Y can be stored in b-bank RAM by m steps, and each column of the matrix Y can be read from the b-bank RAM by n steps. Reading one column vector of the matrix Y from the b-bank RAM can be regarded as reading n column vectors of the matrix 100. Taking above embodiment for example, reading one column vector of the matrix Y can be regarded as reading 4 column vectors of the matrix 100, and the transpose operation of the matrix Y can be achieved thereby. Therefore, a transposed matrix of the N×N matrix is obtained by b-bank RAM and re-grouping access units of the matrix.

The matrix transposing circuit disclosure in this disclosure, the input data and output data are data stored in the N entries of the matrix 100. That is, the N row vectors of the matrix 100 are input to the circuit sequentially and the N column vectors of the matrix 100 are output from the circuit sequentially. Therefore, an input register array and an output register array are used to accomplish a purpose of N entries (row vectors of matrix X) are input and N entries (column vectors of the matrix X) are output.

Figure 4:
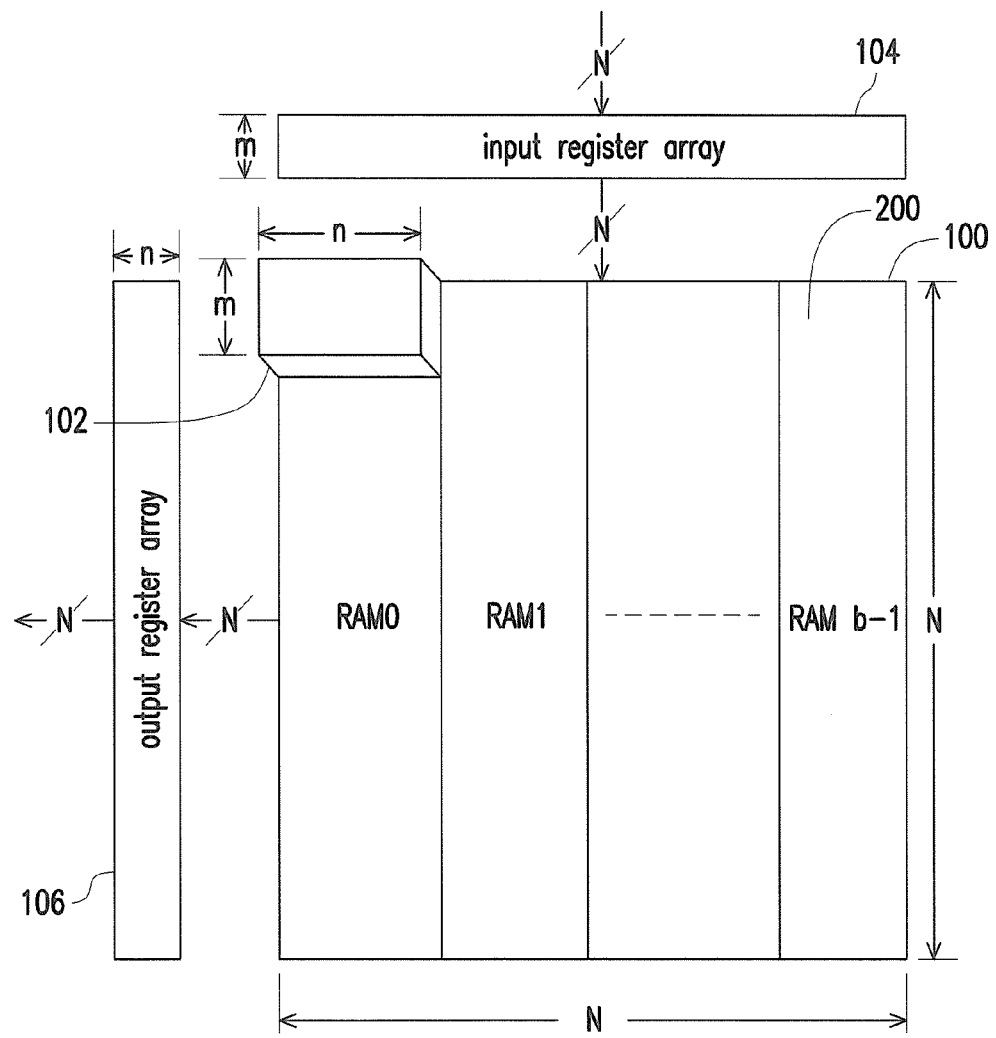
FIG. 4 is a diagram showing a matrix transposing circuit according to an embodiment of the disclosure.

FIG. 4 is a diagram showing a matrix transposing circuit according to an embodiment of the disclosure. Referring to FIG. 4, the matrix transposing circuit 90 includes a memory 200, in which total capacity of the memory 200 can store at least one N×N matrix 100. The memory includes b-band RAM, RAM0, RAM1 ... RAM b−1, which are regarded as b storage blocks. The matrix transposing circuit 90 further includes an m×N input register array 104 and an N×N output register array 106. The parameters of N, m, n, b are integer in power of 2, and N=n×m×b. As described in FIG. 1, the matrix Y is obtained by dividing the matrix 100 into multiple sub-matrixes, which corresponds to b-bank RAM of the memory 200. Memory address of each RAM stores m×n entries.

The input register array receives the row vectors of the matrix 100, transforms them into the entries of the matrix Y. The entries of the matrix Y are stored in b-bank RAM of the memory 200. The output register array 106 receives the entries of the matrix Y from the b-bank RAM of the memory 200, and further transforms them into column vectors of the matrix 100.

The input data and output data received and transmitted by the input register array 104 are N entries of the matrix 100. The input register array functions as a buffer configured for storing the entry units of the matrix Y in b-bank RAM of the memory 200. The operation steps of the input register array 104 are as follows:

1. Pushing the 1×N row vectors $\{x_{r, i=0, 1 \ldots m-1}\}$ of the matrix 100 into the m×N input register array 104 one by one. This operation continues m steps until the m×N input register array 104 is filled up. The notation $x_{r, i=0, 1 \ldots m-1}$ represent the entries of a row of the matrix 100.

2. In following N-m steps, pushing the remaining part $\{x_{r,m}, x_{r,m+1} \ldots x_{r,n-1}\}$ of the row vectors into the input register array 104 one by one. At the same time, also storing b entries $y_{i,j}$ into b-bank RAM. There are b×m×n entries can be stored in the RAM every time since that there are m×n entries in one entry $y_{i,j}$. The number of entries stored in the RAM is N (=b×m×n), which equals to the number of entries of one row of the matrix 100. The input register array 104 maintains N inputs and N outputs. Regarding to the storage for storing entries $y_{i,j}$ of the matrix Y in the RAM, it follows the Rule 1.

3. In following m steps, storing the entries $y_{i,j}$ of the input register array 104 in b-bank RAM according to the Rule 1.

After the matrix 100 is completely stored in b-bank RAM of the memory 200 by transformation of the input register array 104, the entries $y_{i,j}$ are needed to read from b-bank RAM sequentially and the transposing operation of the matrix 100 is finished thereby. The operation steps of the output register array 106 are as follows:

1. Reading b entries $y_{i,j}$ from b-bank RAM of the memory 200 and storing the b entries into N×N output register array 106. The amount of data for each reading operation equals to that of the N entries since that there are b×m×n entries of the matrix 100 are stored in b entries $y_{i,j}$. After n steps, the N×N output register array 106 is filled up with the b entries.
2. In following N–n steps, reading remaining entries $y_{i,j}$ from b-bank RAM, and pushing the remaining entries $y_{i,j}$ into the output register array 106. At the same time, outputting a N×1 column vector representing a final result of transpose operation. For each step, the output register array 106 maintains N inputs and N outputs since that the b entries of the matrix Y can be read from the b-bank RAM and the N×1 column vector can be output simultaneously.
3. In following n steps, outputting n column vectors of the matrix 100 from the output register array 106, and the operation of transposing the matrix 100 is finished thereby.

The shifting operations of the input register array 104 and the output register array 106 are described as below. In the above description, the input register array 104 and the output register array 106 are considered as interfaces. In order to output a transposed matrix successfully, the shifting operations of data inside the registers can be added one more data conversion respectively.

The following embodiments will explain how the input register array 106 receives the row vectors sequentially, transforming the row vectors into the entries of the matrix Y, and transmitting the entries to b memory blocks (i.e., b-bank RAM) of the memory.

Taking the matrix 100 for instance, each register of the input register array 104 can store 1×n entries of the matrix X.

The shifting operations of the input register array 104 include:
Providing m×(N/n) registers, input and output of each of the registers are n entries;
Dividing the input register array 104 into b sub-register arrays, each of the sub-register arrays includes m×m registers;
Choosing one of two shifting directions (i.e., a first shifting direction or a s second direction) for each of the sub-register arrays (e.g., vertical direction or horizontal direction);
Switching to another shifting direction after all of the input register array is filled; and
Storing data outputted from the b sub-register arrays in the b storage blocks.

Figure 5:
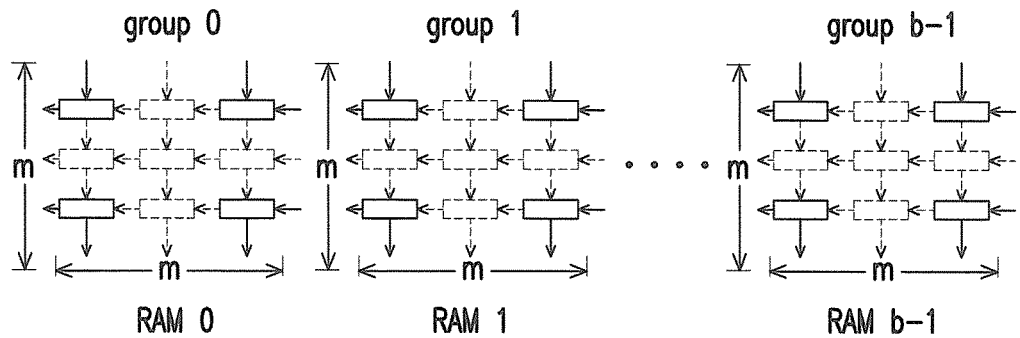
FIG. 5 is a diagram showing the shifting operation of each sub-register array of the input register array according to an embodiment of this disclosure.

FIG. 5 is a diagram showing the shifting operation of each sub-register array of the input register array according to an embodiment of this disclosure. Referring to FIG. 5, the input register array 104 is divided into b sub-register arrays, which correspond to b-bank RAM. Therefore, each RAM receives data from each corresponding m×m registers. In FIG. 5, the number of the registers indicated by broken lines is m×m.

First, each of the sub-register arrays sequentially receives the row vector of the matrix 100 along the first shifting direction (e.g., vertical shifting direction). After all of the input register array 104 are filled, each of the sub-register arrays stores the entries of the row vector in corresponding b-bank RAM along the second shifting direction (e.g., horizontal shifting direction). In following N–m steps, the sub-register array continues to receive the remaining 1×N row vector of the matrix 100.

The input and output data of the input register array 104 are obtained by re-grouping 1×n entries of the row vector of the matrix 100 as a unit. Therefore, (N/n) units are obtained thereby, and these (N/n) units are further divided into b aliquots. After data are divided into b aliquots, data of each aliquot is pushed into b m×m registers.

Taking the matrix 100 for instance, each register of the output register array 106 can store m×1 entries of the matrix X.

The shifting operations of the output register array 106 include:
Providing n×(N/m) registers, input and output of each of the registers are in entries;
Dividing the output register array 106 into b sub-register arrays, each of the sub-register arrays includes N×N registers;
Choosing one of two shifting directions (i.e., a first shifting direction or a s second direction) for each of the sub-register arrays (e.g., vertical direction or horizontal direction); and Reading b-tuple data from the b-bank RAM simultaneously, and output the data after the output register array is filled.

Figure 6:
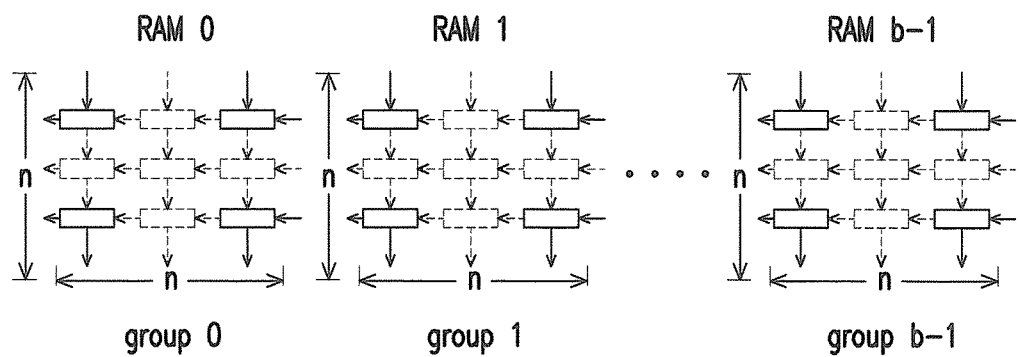
FIG. 6 is a diagram showing the shifting operation of each sub-register array of the output register array according to an embodiment of this disclosure.

FIG. 6 is a diagram showing the shifting operation of each sub-register array of the output register array according to an embodiment of this disclosure. Referring to FIG. 6, the output register array 106 is divided into b sub-register arrays, which correspond to b-bank RAM. Therefore, each RAM receives data from corresponding m×m registers. In FIG. 6, the number of the registers indicated by broken lines is N×N. First, each of the sub-register arrays sequentially receives data read from the RAM along the first shifting direction (e.g., vertical shifting direction). After all of the output register array 104 is filled, each of the sub-register arrays outputs these entries along the second shifting direction (e.g., horizontal shifting direction). The output data of these entries form the transposed matrix of the matrix 100. In following N–n steps, the sub-register array continues to receive remaining data read from b-bank RAM. Therefore, b-tuple data are obtained thereby, and the b-tuple data are pushed into b N×N sub-register arrays of the output register array 10.

Figures 7, 8:
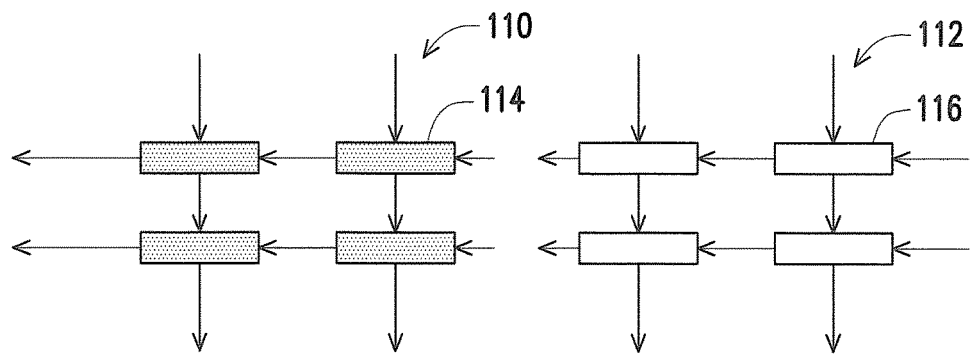
FIG. 7 is a diagram showing the matrix Y is obtained by re-grouping n=4 entries as a unit for each of the row vectors.
FIG. 8 is an architecture of the input register array according to an embodiment of this disclosure, in which N=16, m=2, n=4, b=2.

The embodiment described in FIG. 2a is used to explain the operation of the input and output register arrays. Referring to FIG. 7, the matrix is obtained by re-grouping n=4 entries as a unit for each of the row vectors. For convenience of explanation, each unit is assigned a number as shown in FIG. 7. In this embodiment, the units having gray background such as a0, a1, b0, b1, i2, i3, j2 and j3 are stored in RAM0, and other units having white background are stored in RAM1.

The input and output data of the output register array 106 are obtained by re-grouping each data read from the RAM as n units (i.e., m×1 entries as a unit). After data are divided into b aliquots, data of each aliquot is pushed into b m×m registers. For each read operation, a data is read from one of the b-bank RAM.

Figure 9:
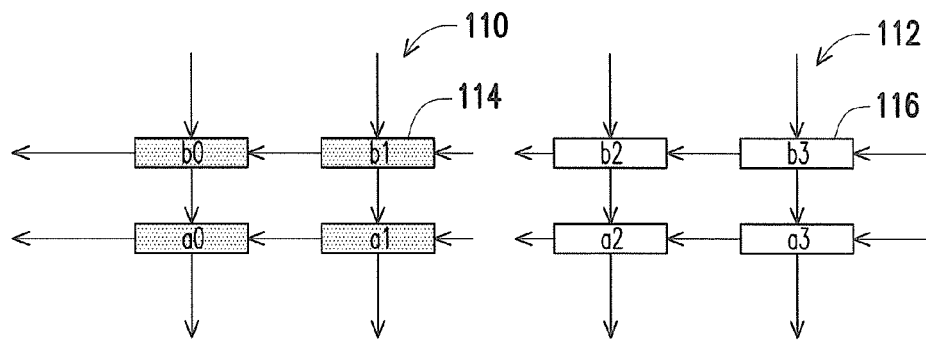
FIG. 9 is diagram showing values stored in the input register array according to said embodiment of this disclosure, in which N=16, m=2, n=4, b=2.

Assuming the input register array receives data in accordance with the order a, b, c, d . . . p. As shown in FIG. 8, the input register array 102 has two sub-register array 110 and 112, and the sub-register array 110 and 112 are respectively composed of 2×2 registers 114 and 116. FIG. 8 is an architecture of the input register array according to an embodiment of this disclosure, in which N=16, m=2, n=4, b=2. The default shifting direction is downward in FIG. 8. In sub-register array 110, the registers 114 having gray background are used to store the units having gray background; and in sub-register array 112, the registers 116 having whiter background are used to store the units having white background. The sub-register arrays have two shifting directions, namely, downward and leftward. After a and b shift downward sequentially, data stored in the sub-register arrays are shown in FIG. 9. FIG. 9 is diagram showing values stored in the input register array according to said embodiment of this disclosure, in which N=16, m=2, n=4, b=2.

Figure 10:
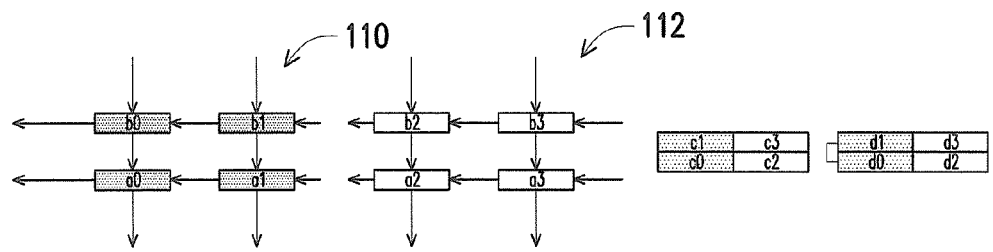
FIG. 10 is diagram showing values stored in the input register array according to said embodiment of this disclosure, in which N=16, m=2, n=4, b=2.

Next, FIG. 10 is a diagram showing values stored in the input register array according to said embodiment of this disclosure, in which N=16, m=2, n=4, b=2. According to FIG. 2a, {a0, b0} is stored in RAM0 and {a2, b2} is stored in RAM1. Then, the next shifting direction is leftward. When vector c and vector d are shifting leftward, the arrangement of the vectors c and d only complies with the access plan of the RAM, but is not limited to specific arrangement.

Figure 11:
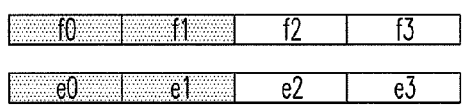
FIG. 11 is diagram showing values stored in the input register array according to said embodiment of this disclosure, in which N=16, m=2, n=4, b=2.
Figure 12:
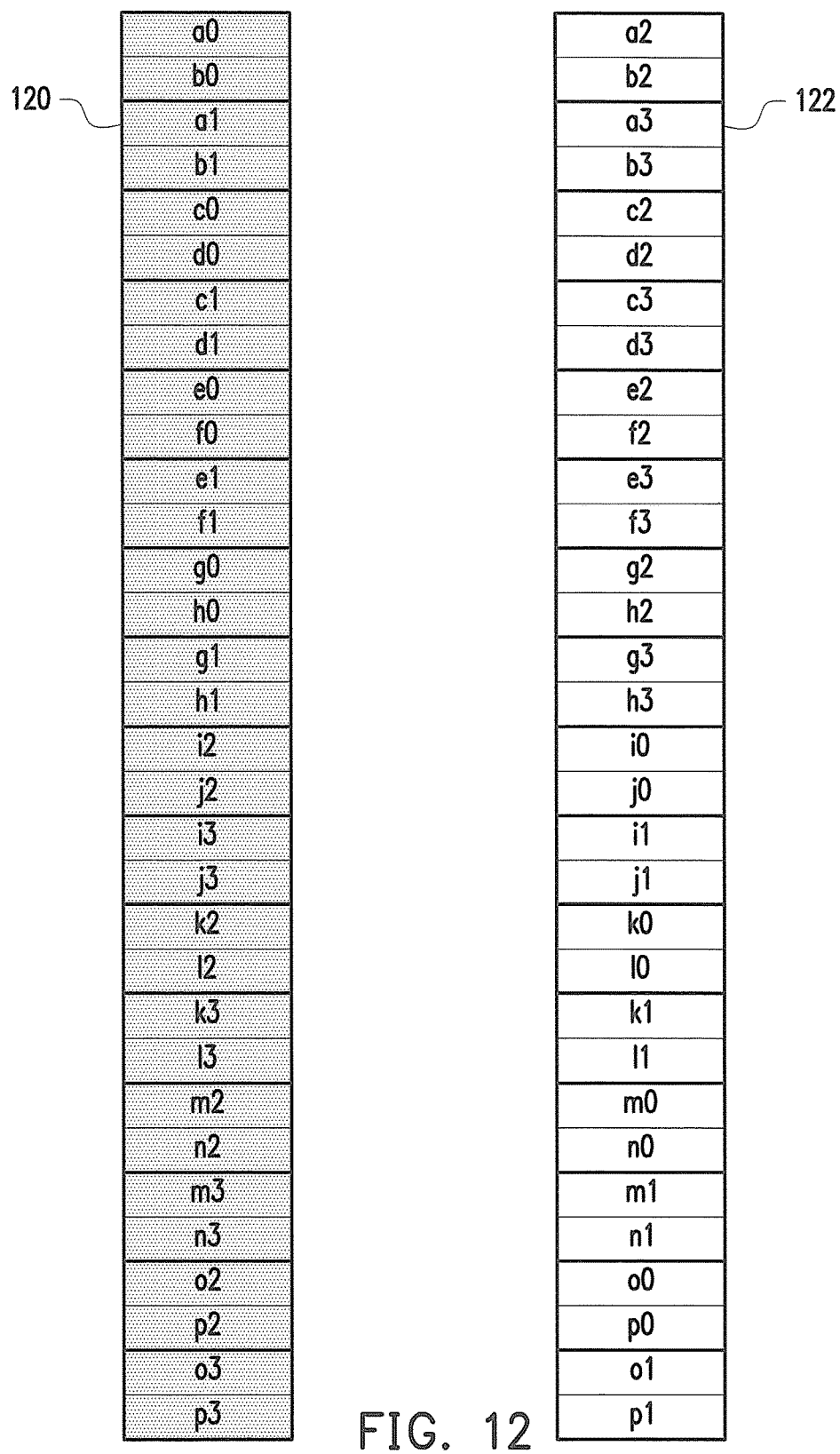
FIG. 12 is a diagram showing that arrangement for the data of matrix X are stored in RAM0 and RAM1.

After two left shifts, values stored in the input register array are shown in FIG. 11. FIG. 11 is a diagram showing values stored in the input register array according to said embodiment of this disclosure, in which N=16, m=2, n=4, b=2. Referring to FIG. 12, it shows that data need to be stored are {c0, d0}, {c2, d2}, {c1, d1}, and {c3, d3}. Therefore, the data {c0, d0}, {c2, d2}, {c1, d1}, and {c3, d3} are output sequentially by changing shifting direction from leftward to downward. At the same time, vectors e and f are pushed in registers and then become the same situation like the vector a and b. By repeating the steps of said operation, the matrix X is stored in memory 200 in form of matrix Y.

After the steps of shifting, data stored in the RAM of the memory 200 are shown in FIG. 12. FIG. 12 is a diagram showing that arrangement for the data of matrix 100 are stored in RAM0 (i.e., storage block (bank) 120) and RAM1 (i.e., storage block (bank) 122). The data stored in bank 120 are a0、b0、a1、b1、c0、d0、c1、d1、e0、f0、e1、f1、g0、h0、g1、h1、i2、j2、i3、j3、k2、l2、k3、l3、m2、n2、m3、n3、o2、p2、o3、p3 sequentially. The data stored in bank 122 are a2、b2、a3、b3、c2、d2、c3、d3、e2、f2、e3、f3、g2、h2、g3、h3、i0、j0、i1、j1、k0、l0、k1、l1、m0、n0、m1、n1、o0、p0、o1、p1 sequentially.

Next, entries of the column vector of the matrix X are clustered by m entries as a unit. FIG. 13 is a diagram showing that the entries of the column vector of the matrix X are clustered by 2 entries as a unit according to an embodiment of the disclosure. In this embodiment, m=2 and division of the matrix X is shown in FIG. 13. By comparing FIG. 7 and FIG. 13, it shows that $\{a0,b0\}^T=\{q0,r0,s0,t0\}$ and $\{c0,d0\}^T=\{q1,r1,s1,t1\}$. If {q0, q1, q2 ... q7} is needed to read out from the RAM to complete the transpose operation, {a0,b0}, {c0, d0}, {e0,f0}, {g0, h0}, {i0, j0}, {k0. l0}, {m0, n0} and {o0, p0} shown in FIG. 12 are needed to be read out from the RAM.

Figure 14:
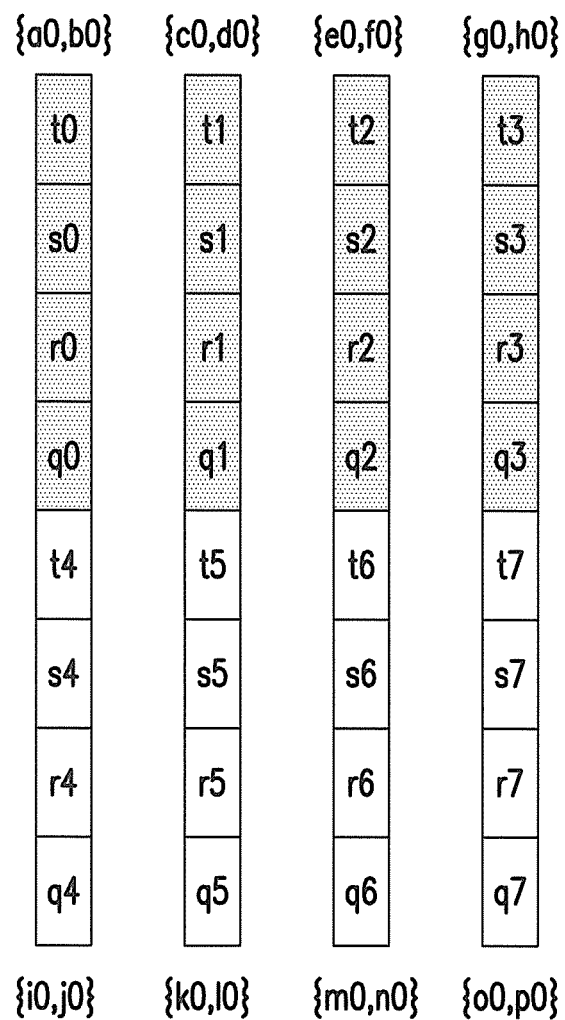
FIG. 14 is a diagram that the output register array 106 is a structure of N×N, and the shifting direction of this embodiment is leftward.
Figure 15:
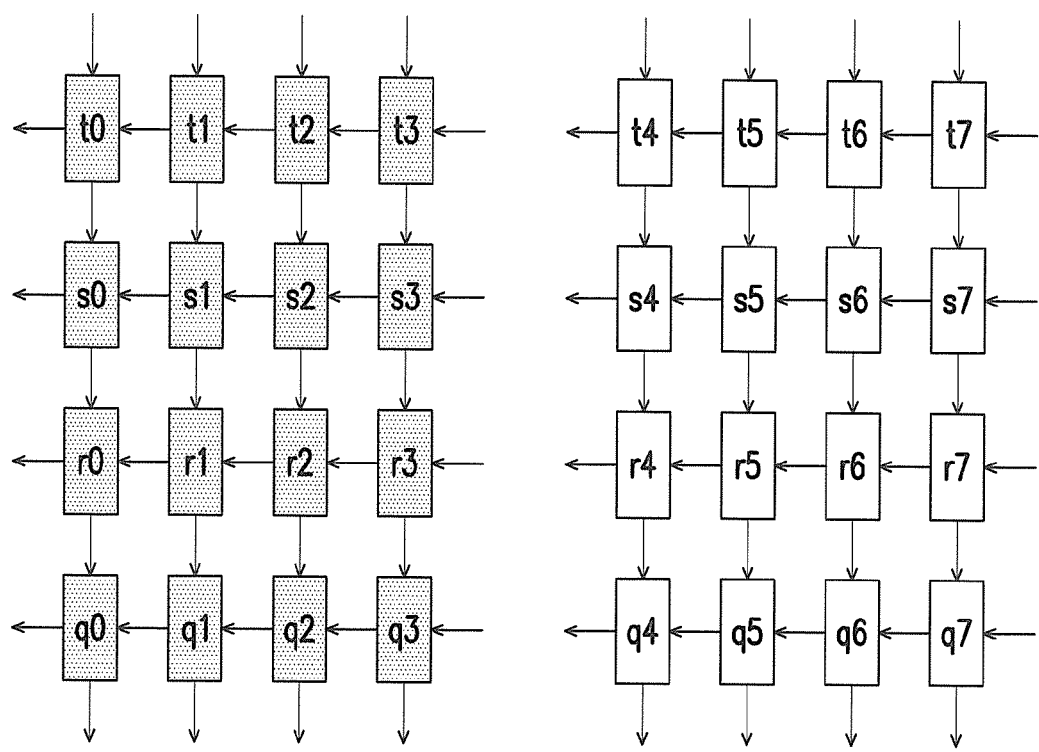
FIG. 15 is a diagram showing relationship between FIG. 7 and FIG. 13 according to an embodiment of the disclosure.

FIG. 14 is a diagram showing relationship between FIG. 7 and FIG. 13 according to an embodiment of the disclosure. Referring to FIG. 14, the output register array 106 is a structure of N×N, and the shifting direction of this embodiment is leftward. {a0,b0} and {i0, j0}, {c0, d0} and {k0, l0}, {e0,f0} and {m0, n0}, {g0, h0} and {o0, p0} are sequentially read out and transformed into vectors q, r, . . . , x. After these vectors enter the input register array 106, data stored in the input register array is shown in FIG. 15. FIG. 15 is a diagram showing relationship between FIG. 7 and FIG. 13 according to an embodiment of the disclosure. In this embodiment, n=4 and therefore an output sub-register array includes 4×4 registers.

Next, {a1,b1} and {i1, j1}, {c1, d1} and {k1, l1}, {e1,f1} and {m1, n1}, {g1, h1} and {o1, p1} are read out from RAM and pushed downward into the output register array, and data stored in the output register array is pushed outside. Referring to FIG. 15, a first data pushed from the output register array is {q0,q1,q2,q3,q4,q5,q6,q7}, which represents a first column vector of the matrix X.

Figures 16, 17:
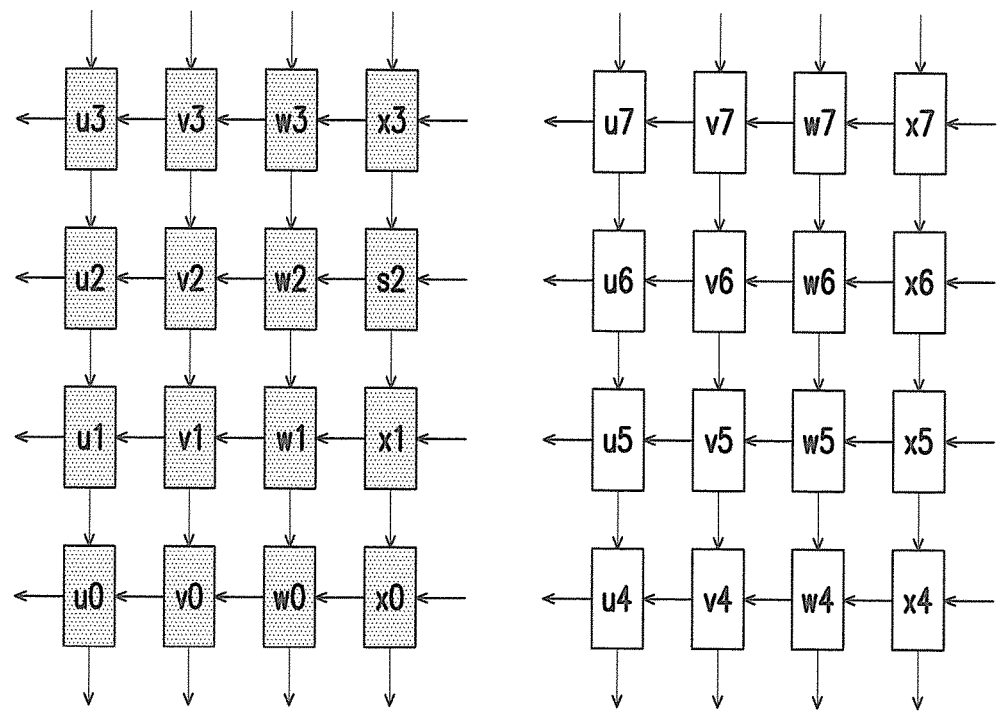
FIG. 16 is a diagram showing relationship between FIG. 7 and FIG. 13 according to an embodiment of the disclosure.
FIG. 17 is a diagram showing the data stored in the output register array according to an embodiment of this disclosure, in which N=16, m=2, n=4, b=2.

FIG. 16 is a diagram showing relationship between FIG. 7 and FIG. 13 according to an embodiment of the disclosure. After pushing data stored in the RAM (shown in FIG. 16) into the output register array, data stored in the output register array is shown in FIG. 17.

FIG. 17 is a diagram showing the data stored in the output register array according to an embodiment of this disclosure, in which N=16, m=2, n=4, b=2. Referring to FIG. 17, the shifting direction is then changed back to leftward shifting direction, and the other column vectors of the matrix X are output from the output register array. By this operation, the transpose operation is completed.

As described above, the input register array according to this disclosure performs a first transformation when some entries are stored in the memory. The output register array according to this disclosure performs a second transformation when these entries are read out from the memory and a transposed matrix of the matrix is obtained thereby.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A matrix transposing circuit for transposing an N×N matrix into a transposed matrix of the matrix, comprising:
   an m×N input register array;
   a memory, having b storage blocks; and
   an N×m output register array;
   wherein N, m, n, b are integer in power of 2, and N=n×m×b,
   wherein the matrix is divided into multiple sub-matrixes, each of the sub-matrixes has m×n entries, a plurality of the entries of the sub-matrixes form a Y matrix,
   wherein the Y matrix is divided into b blocks according to value of b, and respectively stores multiple entry data of the sub-matrixes of the b blocks corresponding to the b storage blocks,
   wherein the input resister receives the entry data along a first shifting direction and outputs data to the b storage blocks along a second shifting direction for corresponding storing the data into the b storage blocks,
   wherein the output resister array receives the entry data from the b storage blocks along the first shifting direction and outputs the entry data corresponding to the transposed matrix along the second shifting direction,
   wherein the input register array sequentially receives m 1×N row vectors of the matrix along the first shifting direction, stores entries of the row vectors in the corresponding b storage blocks along the second shifting direction after the input register array is filled, and receives following N−m 1×N row vectors of the matrix.

2. The matrix transposing circuit as claimed in claim 1, wherein the input register array comprises m×(N/n) registers, wherein input end and output end of the each register of the input register array have n data ports, the m×(N/n) registers are divided into b sub-register arrays, and each of the sub-register arrays has the m×m registers, wherein each of the sub-register arrays of the input register array receives data along the first shifting direction, and switches to the second shifting direction after all of the input register array is filled, wherein data outputted from the b sub-register arrays are stored in the b storage blocks along the second shifting direction.

3. The matrix transposing circuit as claimed in claim 1, wherein the output register array receives data from the b storage blocks along the first shifting direction and outputs entry data corresponding to the transposed matrix along the second shifting direction after the input register array is filled, and receives following data from the b storage blocks.

4. The matrix transposing circuit as claimed in claim 3, wherein the output register array comprises (N/m)×n registers, wherein input end and output end of the each register of the output register array have m data ports, the (N/m)×n registers are divided into b sub-register arrays, and each of the sub-register arrays has the n×n registers, wherein each of the sub-register arrays of the output register array receives data along the first shifting direction, and switches to the second shifting direction after all of the output register array is filled, and receives b-tuple data from b-bank RAM simultaneously and pushes the b-tuple data into the b sub-register arrays.

5. The matrix transposing circuit as claimed in claim 1, wherein N=16, m=2, n=4, and b=2.

6. The matrix transposing circuit as claimed in claim 5, wherein the Y matrix is a 8×4 matrix, $Y_{i,j(=1, 2, \ldots 8, j=1,2,3,4)}$ represent entries of the Y matrix, and the Y matrix is divided into a first block and a second block according to the b value, and entries of the first block are $\{Y_{i,j}, i=1\text{-}4, j=1,2; \text{ and } Y_{i,j}, i=5\text{-}8, j=3,4\}$ and entries of the second block are $\{Y_{i,j}, i=1\text{-}4, j=2,3; \text{ and } Y_{i,j}, i=5\text{-}8, j=1,2\}$.

7. The matrix transposing circuit as claimed in claim 5, wherein the Y matrix is a 8×4 matrix, $Y_{i,j(=1, 2, \ldots 8, j=1,2,3,4)}$ represent entries of the Y matrix, and the Y matrix is divided into a first block and a second block according to the b value, and entries of the first block are $\{Y_{i,j}, i=1,2, j=1,2; Y_{i,j}, i=3,4, j=3,4; Y_{i,j}, i=5,6, j=1,2; \text{ and } Y_{i,j}, i=7,8, j=3,4\}$ and the second block is remaining part of the Y matrix.

8. The matrix transposing circuit as claimed in claim 5, wherein the Y matrix is a 8×4 matrix, $Y_{i,j(=1, 2, \ldots 8, j=1,2,3,4)}$ represent entries of the Y matrix, and the Y matrix is divided into a first block and a second block according to the b value, and entries of the first block are $\{Y_{i,j}, i=1, j=1,2; Y_{i,j}, i=2, j=3,4; Y_{i,j}, i=3, j=1,2; Y_{i,j}, i=4, j=3,4; Y_{i,j}, i=5, j=1,2; Y_{i,j}, i=6, j=3,4; Y_{i,j}, i=7, j=1,2; i=8, j=3,4\}$ and the second block is remaining part of the Y matrix.

9. The matrix transposing circuit as claimed in claim 5, wherein the Y matrix is a 8×4 matrix, $Y_{i,j(=1, 2, \ldots 8, j=1,2,3,4)}$ represent entries of the Y matrix, and the Y matrix is divided into a first block and a second block according to the b value, and entries of the first block are $\{Y_{i,j}, i=1\text{-}4 j=1,3; Y_{i,j}, i=5\text{-}8, j=2,4\}$ and the second block is remaining part of the Y matrix.

10. The matrix transposing circuit as claimed in claim 1, wherein N=16, m=4, n=4, and b=1.

11. The matrix transposing circuit as claimed in claim 1, wherein a first transform is performed by the input register array when entries of the matrix are stored into the memory and a second transform is performed by the output register array when the entries of the matrix are received from the memory.

* * * * *